(12) United States Patent
Basker et al.

(10) Patent No.: US 8,551,313 B2
(45) Date of Patent: Oct. 8, 2013

(54) METHOD AND APPARATUS FOR ELECTROPLATING ON SOI AND BULK SEMICONDUCTOR WAFERS

(75) Inventors: Veeraraghavan S. Basker, Schenectady, NY (US); Eduard Cartier, New York, NY (US); Hariklia Deligianni, Tenafly, NJ (US); Rajarao Jammy, Austin, TX (US); Vamsi K. Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 1120 days.

(21) Appl. No.: 11/940,720

(22) Filed: Nov. 15, 2007

(65) Prior Publication Data

US 2009/0127121 A1  May 21, 2009

(51) Int. Cl.
*C25D 5/02* (2006.01)

(52) U.S. Cl.
USPC ............. 205/91; 205/118; 205/147; 205/157; 204/242; 204/297.01

(58) Field of Classification Search
USPC .................................................. 205/147, 91
See application file for complete search history.

(56) References Cited

U.S. PATENT DOCUMENTS

| | | | | |
|---|---|---|---|---|
| 4,217,183 A * | 8/1980 | Melcher et al. | ................. | 205/92 |
| 4,247,373 A * | 1/1981 | Shimano et al. | .............. | 438/384 |
| 4,302,316 A | 11/1981 | Nester | | |
| 4,399,004 A * | 8/1983 | Buckley et al. | ................. | 205/91 |
| 4,425,196 A * | 1/1984 | Bessette et al. | ................. | 205/91 |
| 4,469,564 A | 9/1984 | Okinaka et al. | | |
| 4,657,833 A * | 4/1987 | Hadley et al. | .................... | 430/52 |
| 5,648,277 A * | 7/1997 | Zhang et al. | .................. | 438/151 |
| 5,810,989 A * | 9/1998 | Krihak et al. | .................... | 205/91 |
| 6,132,586 A * | 10/2000 | Adams et al. | ................. | 205/123 |
| 2002/0096433 A1* | 7/2002 | Tatsuura et al. | ................. | 205/92 |
| 2004/0178060 A1 | 9/2004 | Ravkin et al. | | |
| 2005/0242398 A1* | 11/2005 | Chen et al. | .................... | 257/348 |
| 2006/0042953 A1* | 3/2006 | Ramarajan et al. | ........... | 205/125 |
| 2006/0166474 A1* | 7/2006 | Vereecken et al. | ............ | 438/584 |

* cited by examiner

*Primary Examiner* — Harry D Wilkins, III
*Assistant Examiner* — Bryan D. Ripa
(74) *Attorney, Agent, or Firm* — Connolly Bove Lodge & Hutz LLP; Louis J. Percello, Esq.

(57) ABSTRACT

An electroplating apparatus and method for depositing a metallic layer on the surface of a wafer is provided wherein said apparatus and method do not require physical attachment of an electrode to the wafer. The surface of the wafer to be plated is positioned to face the anode and a plating fluid is provided between the wafer and the electrodes to create localized metallic plating. The wafer may be positioned to physically separate and lie between the anode and cathode so that one side of the wafer facing the anode contains a catholyte solution and the other side of the wafer facing the cathode contains an anolyte solution. Alternatively, the anode and cathode may exist on the same side of the wafer in the same plating fluid. In one example, the anode and cathode are separated by a semi permeable membrane.

17 Claims, 6 Drawing Sheets

Method and apparatus for electroplating on SOI wafers

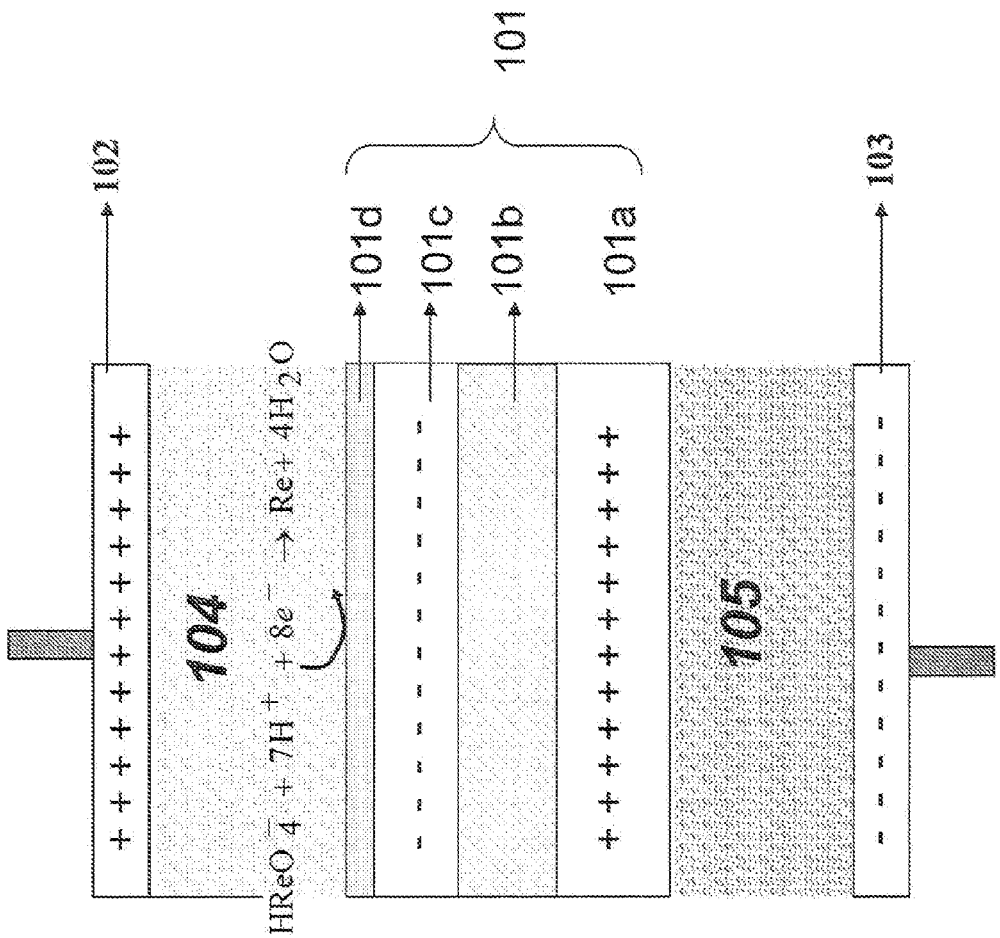
Figure 1. Scheme for electroplating on SOI wafers

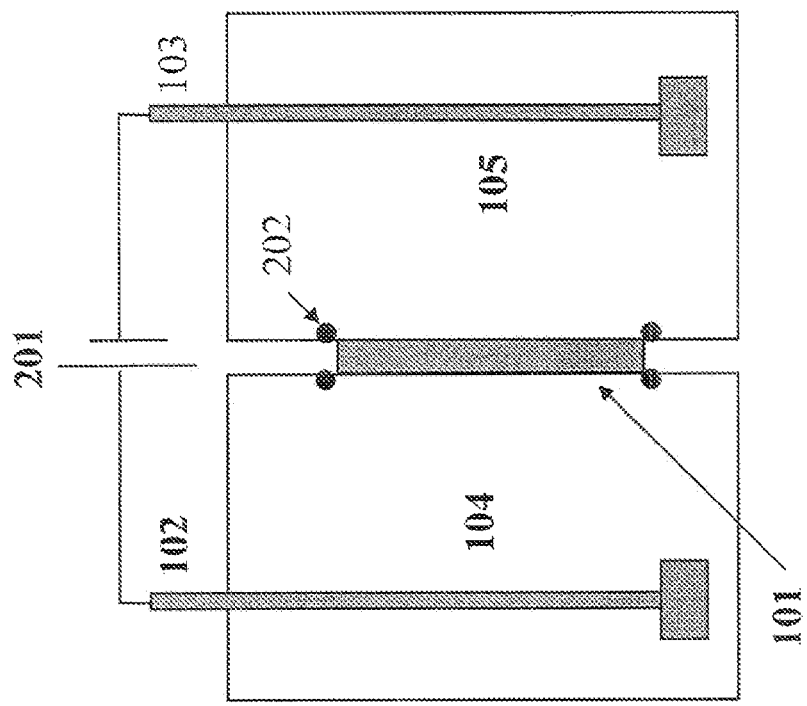
Figure 2. Basic tool for electroplating on SOI wafers

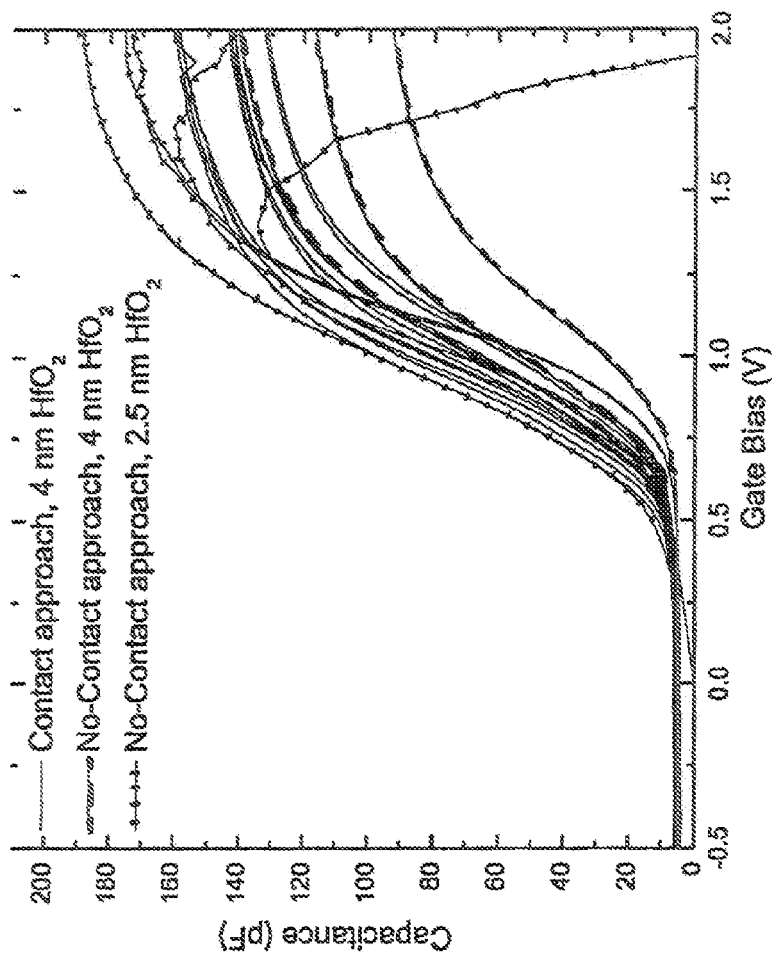
Figure 3. C-V curves of Re deposited by Contactless approach

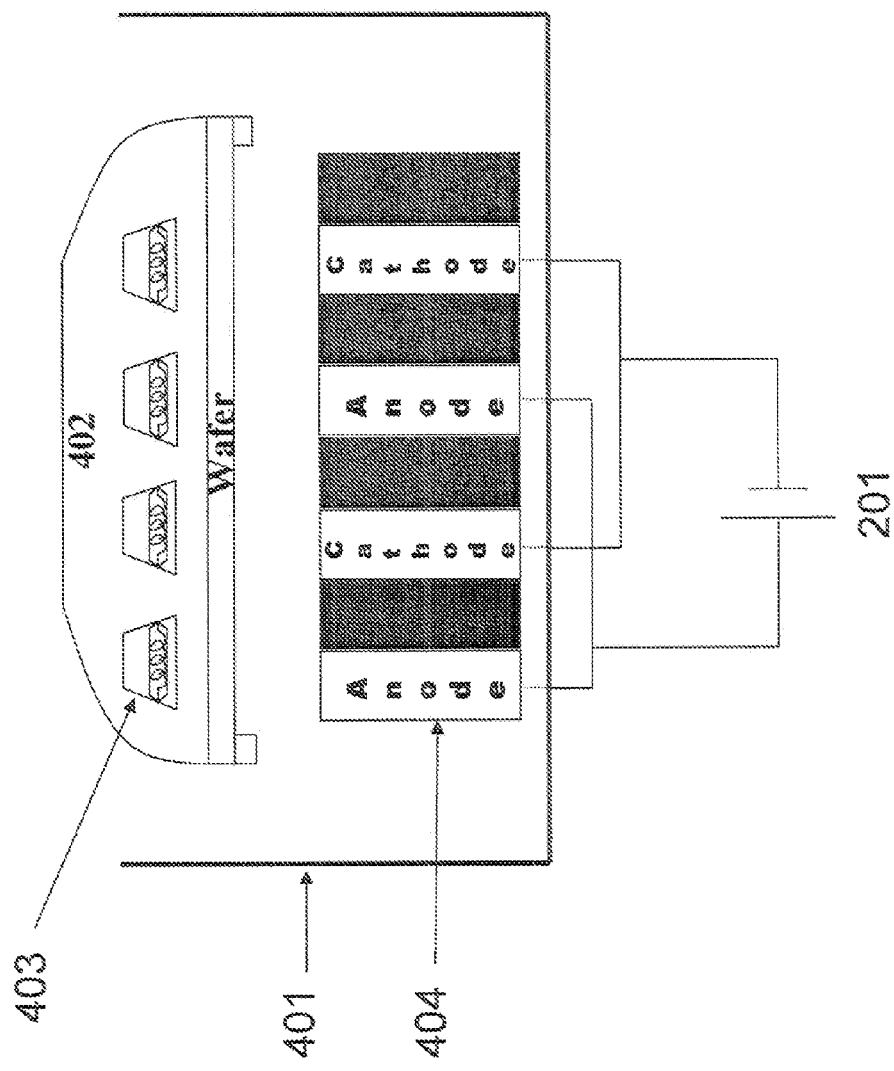
Figure 4. Method and apparatus for electroplating on SOI wafers

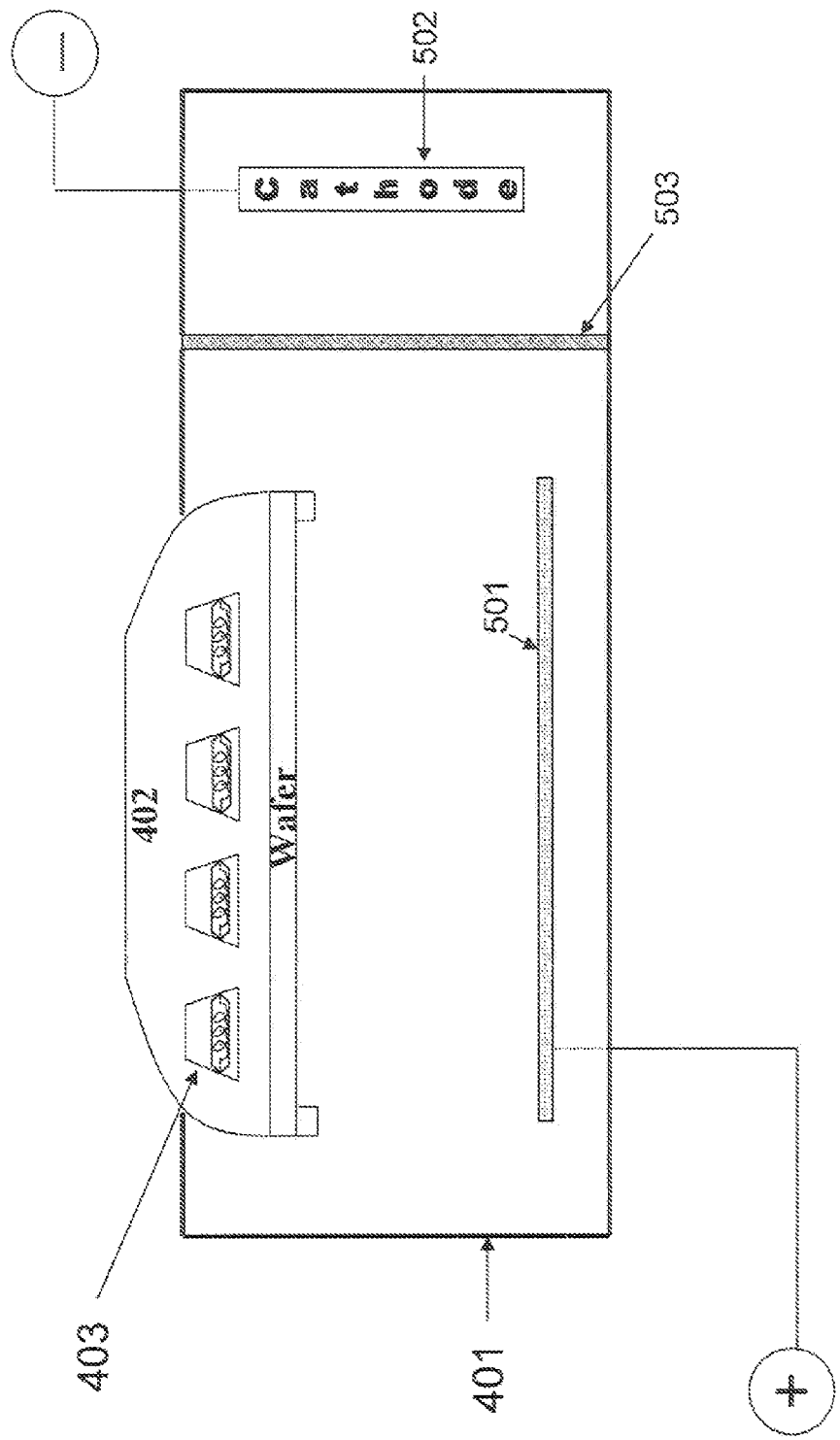
Figure 5. Method and apparatus for electroplating on SOI wafers

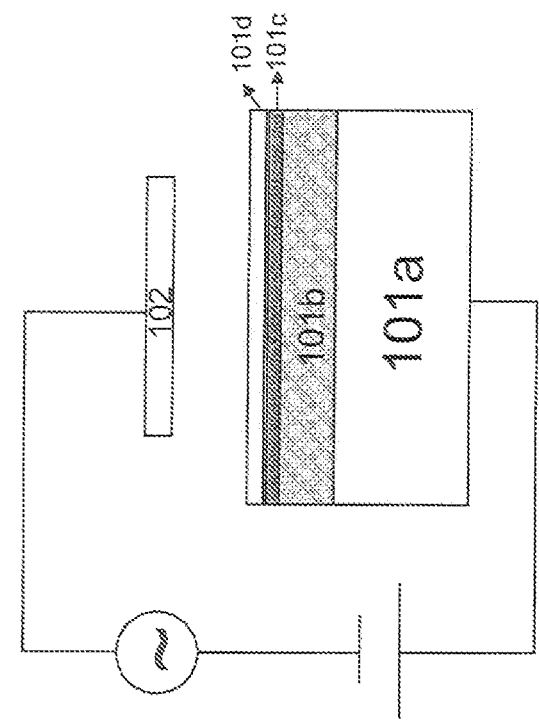
Figure 6a – Conductive SOI approach
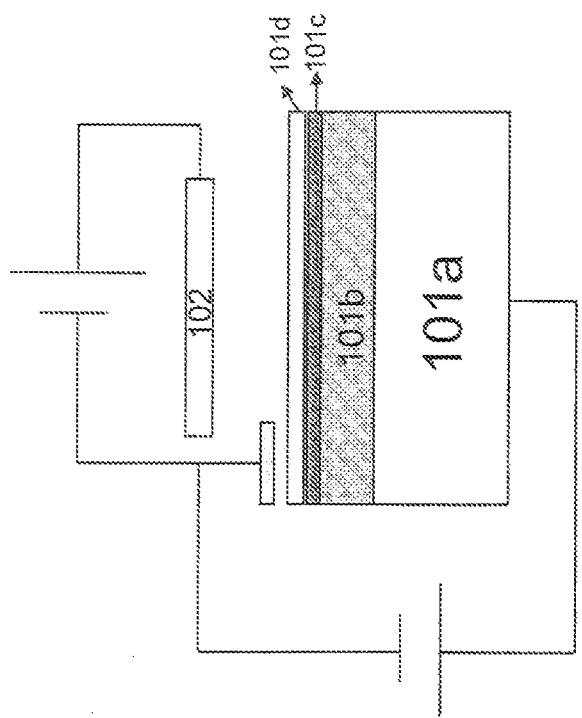
Figure 6b – Alternating/pulse applied current/voltage approach

METHOD AND APPARATUS FOR ELECTROPLATING ON SOI AND BULK SEMICONDUCTOR WAFERS

TECHNICAL FIELD

The disclosure relates to electroplating apparatuses and processes for depositing a metallic layer on the surface of a wafer, wherein the apparatuses and processes do not require physical attachment of an electrode to the wafer.

BACKGROUND OF THE DISCLOSURE

Miniaturization has been the basis of tremendous success in the semiconductor industry. To continue downsizing, however, innovative methods are required to overcome new challenges. For example, as semiconductor wafers become smaller, it is more important to isolate and direct electrical charges to avoid interference. One solution is silicon-on-insultor ("SOI") technology. SOI technology is a semiconductor fabrication technique perfected by IBM that uses pure crystal silicon and silicon oxide for integrated circuits and microchips. G. Shahidi, *SOI Technology for the GHz Era*, IBM J. RES. & DEV., 46:2/3, 121-131 (2002). An "SOI" wafer is, for example, a wafer wherein a layer of buried oxide ("BOX") is implanted between two sides of a semiconductor substance. Most SOI wafers are fabricated by use of one of two basic approaches. SOI wafers may be fabricated with the SIMOX™ (Separation by Implanted Oxygen) process, which employs high dose ion implantation of oxygen and high temperature annealing to form the BOX layer in a bulk wafer. Alternatively, SOI wafers can be fabricated by bonding a device quality silicon wafer to another silicon wafer that has an oxide layer on its surface. The pair is then split apart, using a process that leaves a thin (relative to the thickness of the starting wafer) device-quality layer of single crystal silicon on top of the oxide layer. This is called the "layer transfer" technique, because it transfers a thin layer of device-quality silicon onto an oxide layer that was thermally grown on a wafer. An SOI wafer has a buried oxide layer typically less than 100 nm thick. This oxide layers acts as an insulator to stop unwanted electrical loss. The amount of electrical charge the transistor has to move during a switching operation is reduced making it faster and allowing it to switch using less energy. SOI wafers can provide a 20-35% performance gain over bulk complementary metal-oxide semiconductor ("CMOS") based chips. G. Shahidi, *SOI Technology for the GHz Era*, IBM J. RES. & DEV., 46:2/3, 121-131 (2002). Also, SOI chips reduce the soft error rate, which is data corruption caused by cosmic rays and natural radioactive background signals. As miniaturization continues, SOI is expected to be the technology of choice for system-on-a-chip applications which require high-performance CMOS, low-power, embedded memory, and bipolar devices.

High performance CMOS devices increasingly incorporate high-k gate dielectrics and metal gates. In the fabrication of metal gates, the conventional approach has been subtractive, i.e., the metal gate material is applied as a blanket layer and then selectively removed from regions where it is not wanted. For example, when electrodeposition technique is used for fabrication of metal structures on dielectrics, the electrodeposited metal is nearly always deposited on a metallic seed or plating base layer formed on a substrate by a method other than electrodeposition (e.g., physical vapor deposition (PVD), chemical vapor deposition (CVD), etc.). The main path for the current flow driving the electrodeposition is laterally through the seed layer, from contact established at the seed layer edges. Current through the substrate itself, and any dielectric layers contained therein, is typically completely negligible. Plating can be limited to selected areas of the seed layer by using though-mask plating techniques, wherein one plates through the openings in an insulating masking layer disposed directly on the seed layer. So for metal gate application, the gate metal may be selectively deposited on the desired gate regions by through-mask plating onto a blanket conductive seed layer, which would typically be removed from the masked regions after the plating process. Gates for n-FET and p-FET devices have different work functions and comprise different metals, which mean that the additive through-mask plating approach must be done more than once. An electrodeposition approach is described as an additive method for forming metal gates for field effect transistors in U.S. Patent Application Publication No. 20050095852 entitled "Field Effect Transistor with Electroplated Metal Gate," the entire disclosure of which is incorporated herein by reference. Methods of electrodeposition are provided in U.S. Patent Application Publication No. 20060166474, which is also incorporated herein by reference in its entirety. These publications show electroplating metal on resistive substrates for various applications using backside contact so that the wafer is used as the source of electrons for the electroplating process.

SUMMARY OF THE DISCLOSURE

The present disclosure relates to a non-contact type electroplating apparatuses and processes for depositing a metallic layer on the surface of a wafer. Additionally, the present disclosure addresses the limitations with contact-type electroplating of SOI wafers. For example, contact-type electroplating is generally not suitable for plating on SOI because it is difficult to pass a current across a buried oxide of thickness 500 Å or above without electrically breaking the oxide. According to an aspect of the present disclosure an apparatus is provided having at least two chambers separated by a wafer wherein the wafer is the product of interest. An electrode is provided in one of the chambers, which contains an electrolytic solution. The electrode is connected to an electric power source but is not physically connected to (does not physically touch) the wafer. Another electrode is in the second chamber, which also contains an electrolytic solution. The electrode in the second chamber is connected to an electric power source but is not physically connected to (does not physically touch) the wafer. Typically, the distance between the electrode and the wafer is about 0.1 mm to about 12 cm and a voltage of about 10 volts to about 40 volts is applied. The apparatus may optionally further comprise an electron source positioned to provide electrons to the surface of the wafer opposite the face to be electroplated. This can be achieved by the illumination of the backside of the semiconductor wafer or by illuminating the electrolyte solution, which is in contact with the backside of the wafer. The light wavelength will activate the electrochemical processes only where either the complete band gap can be crossed or gap states can be activated to mediate the electrode reaction.

According to another aspect of the present disclosure the wafer does not separate the plating tank into two chambers. The apparatus has a wafer holder that positions the wafer in an electrolytic solution. At least one anode is positioned in front of the face of the wafer to be electroplated but does not physically touch the wafer. The cathode or cathodes are selectively separated from the anode(s) by one or more ion selective membranes, such as Nafion®. The apparatus may optionally further comprise an electron source positioned to provide electrons to the surface of the wafer opposite the face to be electroplated. This can be achieved by the illumination of the backside of the semiconductor wafer or by illuminating the electrolyte solution, which is in contact with the backside of the wafer. The light wavelength will activate the electrochemical processes only where either the complete band gap can be crossed or gap states can be activated to mediate the electrode reaction.

According to another aspect of the present disclosure the apparatus has a wafer holder that positions the wafer in an electrolytic solution and at least one anode and at least one cathode are positioned in front of the face of the wafer to be electroplated but do not physically touch the wafer. The anode(s) and cathode(s) are separated from each other by an insulator, except for the ends, which face the side of the wafer to be electroplated. Typically, the distance between the ends of the anode(s) and cathode(s) and the wafer is about 0.1 mm to about 12 cm.

The apparatus may optionally further comprise an electron source positioned to provide electrons to the surface of the wafer opposite the face to be electroplated. This can be achieved by the illumination of the backside of the semiconductor wafer or by illuminating the electrolyte solution, which is in contact with the backside of the wafer. The light wavelength will activate the electrochemical processes only where either the complete band gap can be crossed or gap states can be activated to mediate the electrode reaction.

In one embodiment of the present disclosure, the wafer to be electroplated may be a semiconductor substrate. In another embodiment, the wafer is an SOI wafer. The buried oxide thickness is about 1 Å to about 5000 Å and a range of about 500 Å to about 1500 Å. In another embodiment, the SOI wafer has a high-k oxide layer. The high-k oxide layer may be selected from the group consisting of $HfO_2$, $ZrO_2$, $Y_2O_3$, $La_2O_5$, HfSiO and $Al_2O_3$.

In one embodiment, illumination is provided by a halogen light at intensity greater than that achieved by typical ambient light. Alternatively, a narrow laser beam can be used to directly write an etched or deposited pattern, or a mask can be used to illuminate only certain regions of the semiconductor wafer surface.

In another embodiment of the present disclosure, the electrolytic solution is an acid copper plating solution comprising dissolved copper such as copper sulfate, an acid electrolyte such as sulfuric acid in an amount sufficient to impart conductivity to the electrolytic solution. Additives may also be added to the electrolytic solution to improve the uniformity of the plating and the quality of the metal deposit. Such additives include brighteners, levelers, surfactants, and suppressants. Examples of additives include, but are not limited to SPS, sodium citrate, Sodium dodecyl benzene sulfonate etc.

BRIEF DESCRIPTION OF THE DRAWINGS

The disclosure is best understood from the following detailed description when read in connection with the accompanying drawings. It is emphasized that, according to common practice, the various features of the drawings are not to scale. On the contrary the dimensions of the various features are arbitrarily expanded or reduced for clarity. Included in the drawings are the following figures:

FIG. 1 is a cross-sectional view of a SOI wafer positioned between a cathode and an anode.

FIG. 2 is a cross-sectional view of an electroplating apparatus wherein a SOI wafer physically separates two chambers, one containing an anode within a catholyite solution, the other containing a cathode in an anolyte solution.

FIG. 3 is a graphical depiction showing the C—V curves of Re deposited without physical contact between the cathode and substrate.

FIG. 4 is a cross-sectional view of a contact-less electroplating apparatus wherein both anodes and cathodes reside in the same plating fluid and are positioned on the same side of the substrate.

FIG. 5 is a cross-sectional view of a contact-less electroplating apparatus wherein the anode and cathode are separated by an ion selective membrane.

FIG. 6a is a depiction showing an electroplating process wherein physical contact is established between a substrate and a cathode.

FIG. 6b is a depiction showing an electroplating process wherein physical contact is established between a substrate and a cathode and an AC/pulse is applied.

DETAILED DESCRIPTION OF THE INVENTION

FIG. 1 shows a working schematic of the process, where the wafer acts as a bipolar electrode. In this illustration, the wafer 101 is a SOI substrate composed of Si 101a, buried oxide 101b, SOI 101c and high-k oxide 101d. Counter electrodes 102 and 103 are placed in each compartment and the circuit is completed by making electrical connections to the counter electrodes and the wafer 101 physically separates the two electrolyte compartments. The SOI wafer can be either bonded or it can be a SIMOX wafer. On the other hand, a bulk substrate can also be plated using this process. The schematic also shows how charges are introduced on each side of the wafer. As the wafer acts as a bipolar electrode, the side facing the negative counter electrode in the anolyte compartment acts as anode and the side facing the positive counter electrode in the catholyte compartment acts as cathode. The catholyte compartment contains the electroplating solution 104, which may be rhenium electroplating solution. The anolyte compartment contains a supporting solution 105 or if desired, the anolyte compartment can also be used to carry out any electrochemical reaction of interest. FIG. 2 shows a basic configuration of the apparatus. The apparatus is designed to handle wafers of about 125 mm in diameter or bigger. The counter electrodes 102 and 103 can be insoluble material such as Pt or platinized Ti. In some cases such as copper plating, the anode can be soluble and made out of copper. The two counter electrodes are connected to the power supply 201. The wafer is held in place with the help of O-rings 202. For electroplating, the catholyte compartment 104 is filled with the electroplating solution and a supporting solution is used in the anolyte compartment 105. The wafer substrate 101 is held in such a way that the surface to be plated faces the catholyte compartment.

FIG. 3 shows the capacitance-voltage characteristics of electrodeposited Re on a bulk n-Si/10 Å $SiO_2$/30 Å or 40 Å $HfO_2$ stack MOS test structures (100 μm×100 μm). The measurements were made after the test structures was exposed to a 550° C. forming gas anneal for 30 minutes. For comparison, a test structure which is fabricated via a backside contact scheme on n-Si/10 Å $SiO_2$/40 Å $HfO_2$. The C—V curves show that the electrical characteristics of Re electrodeposited using the contactless scheme is comparable to the Re deposited using the backside contact process.

FIG. 4 illustrates another embodiment which can be utilized to electrochemically process SOI wafers. In this case, the apparatus comprises a plating tank 401. The wafer holder 402 is used to host the wafer and may additionally provide agitation by rotation. The wafer holder can additionally have a light source 403 which to illuminate p-type wafers. As electrons are required for electrodeposition process, the light source assists in generating electrons in the semiconductor wafer for the electrochemical reaction. In the case of electroetching, the reverse is true, i.e., the light source assists in generating holes for n-type silicon. The electrical connection is made to the cathode and anode segments 404 respectively. As the wafer rotates, electroplating is carried on selectively wherever the wafer passes over the anode regions and vice versa, as per the mechanism discussed in FIG. 1.

FIG. 5 shows an embodiment which incorporates a modification to the way the wafer is facing the counter electrode and the separation of the two compartments. The plating tank 401 comprises a tool head 402 containing the lamp assembly 403. The counter electrode 501 faces the wafer. This counter electrode is a positive electrode if the desired electrochemical reaction on the wafer substrate is electrodeposition. The other electrode 502 (in this case a negative electrode), is placed in a separate chamber which is separated by an ion-selective membrane 503 such as Nafion® (tetrafluoroethylene-perfluoro-3,6-dioxa-4-methyl-7-octenesulfonic acid copolymer, also known as ethanesulfonyl fluoride, 2-[1-[difluoro-[(trifluoroethenyl)oxy]methyl]-1,2,2,2-tetrafluoroethoxy]-1,1,2,2,-tetrafluoro-, with tetrafluoroethylene). This arrangement can be used in case a huge potential drop that may be associated with the tool shown in FIG. 2 is to be eliminated.

These processes and apparatuses are very useful for electrochemical processing of metal/semiconducting/insulating layers on SOI wafers, as they do not require passing current through the substrate in the case of a backside contact. This process is also useful in processing bulk wafers and can be used for applications such as direct electrodeposition of metal gates on high-k oxides for field effect transistors (FETs) or DRAM capacitors.

FIGS. 6a and 6b show alternate processes for plating on SOI substrates. In FIG. 6a, there are two different electrical circuits connected to the wafer. One of the circuits applies a bias between the Si substrate 101a and the insulating layer 101d, thereby making the SOI (101c) conductive by generating equal and opposite charges in the SOI layer. This phenomenon is similar to the operation of a field effect transistor; only in this case, the SOI layer of the entire wafer is conductive, thereby rendering it receptive to electrodeposition. The second electrical circuit then applies a bias between the insulating layer 101d and the counter electrode 102 thereby enabling electrochemical reaction on the insulating layer.

FIG. 6b shows the AC/Pulse plating approach for plating on SOI wafers. This process utilizes the fact that the impedance of the buried oxide 101b to an applied electric field approaches zero in the presence of a changing electric field. However, in order to prevent continuous deposition/dissolution, the electrical input is designed in such a way that the electrical signal always remains negative for electrodeposition. This can also be achieved by applying a pulse signal with high frequency.

In electroplating processes, one or more of several processes of applying a current or voltage can be used. These include, for example: application of a constant current of about 1 mA/cm$^2$ to about 50 mA/cm$^2$ or equivalent potentials (electrode potentials of about −2V to about −3V versus Normal Hydrogen Electrode ("NHE")); and pulse plating with a first current of about 5 mA/cm$^2$ to about 250 mA/cm$^2$ for about 20 milliseconds to about 5 seconds such as about 0.1 second, and a second current of about 1.0 µA/cm$^2$ up to about 2 mA/cm$^2$ for about 0.1 seconds to about 10 seconds, including pulse plating with potentials of about −2V to about 3.5V versus NHE for about 1 cycle to about 500 cycles such as 25 cycles. The temperature during processing can, for example, range about 20° C. to about 90° C.

Included in the above processing conditions are those in which there is applied a constant current of about 10 mA/cm$^2$ for about 30 minutes at room temperature with agitation at about 100 rpm.

In one embodiment, the electrochemical process involves the electrodeposition of a metal layer on a 125 mm or larger semiconductor wafer. The electrodeposition process also includes providing an electron source in order to facilitate the electrodeposition of the metal layer on semiconductor wafers with low or no electrons such as p-type silicon. The electron source can be in the form of illumination.

In one embodiment, illumination is provided by a halogen light at intensity greater than that achieved by typical ambient light. Alternatively, a narrow laser beam can be used to directly write an etched or deposited pattern, or a mask can be used to illuminate only certain regions of the semiconductor wafer surface.

In another embodiment, the electrochemical process involves the electroetching and/or anodization of a metal layer. The electrochemical process also includes providing a light source in order to facilitate the electroetching and/or anodization of a metal layer from the semiconductor wafer. The electroetch or anodizing process will include a metal layer comprising one or more metals selected from Al, Ti, Zr, Nb, Hf, Ta, W, Mo and Cd. The semiconductor wafer can comprise Si, Ge, In, Ga, Sb, P and any combination thereof.

The electrochemical process of the disclosure includes electrodeposition processes in which one or more metals selected from the group consisting of Ru, Re, Ni, Pd, Co, Pt, Rh, Cr and Mn and any combination of each metal thereof is deposited on the semiconductor wafer. Other select metals and non-metals selected from the group consisting of Os, Ir, Sb, Bi, Sn, In, Ga, Ge, As, Fe, Zn, Cd, Se, Te, Cu, Ag, Au, W, Hg, Tl, Po, Pb, Mo, V, B, C, P, S and any combination of each metal thereof can also be deposited on the semiconductor wafer. In one embodiment, the one or more metals are selected from the group consisting of Ru, Re, Ni, Pd, Co, Pt, Rh, Cr, Mn, Cu, Fe, Zn, Cd, Ce, Ta, Hf, Ti, Al, V, Ga, Ge, As, Se, Nb, Mo, Ag, In, Sn, Sb, Te, W, Os, Ir, Au, Hg, Tl, Pb, Bi, P, B, C, N, O, Cl or any combination thereof is deposited on the semiconductor wafer.

It should be understood that the foregoing description of exemplary embodiments is presented for the purpose of illustrating and describing the main points and concepts of the present disclosure. The present disclosure is not limited, however, to these embodiments. The physical configuration of the apparatus may be varied while keeping within the scope and spirit of the present disclosure. For example, the apparatus may be suited to accommodate a substrate of any configuration. The shape of the electrodes extending around the substrate corresponds to the shape of the substrate being electroplated and, therefore, may assume a variety of shapes. The peripherally extending electrode may also consist of more than one electrode, which may be separately connected to distinct power supplies. This arrangement would depend on the configuration of the plating surface on the substrate. Additional variations of the features which comprise the present disclosure may also be made without departing from the scope and spirit of the present disclosure.

EXAMPLES

Copper Electrodeposition

A plating solution comprising about 1 g/liter to about 300 g/liter of $CuSO_4$, 1 ml/liter to about 250 ml/liter of $H_2SO_4$ and 1 to 10,000 ppm of Cl⁻ can be used. For example, the plating solution can comprise about 240 g/liter of $CuSO_4$ and about 100 g/liter of $H_2SO_4$, having a pH from about 1 to about 2. The source of the Cl⁻ is sodium chloride. In addition, other inorganic constituents such as bromides, iodides, fluorides, sulfides, sulfates, boric acid, borates and metal salts & organic additives such as surfactants, brighteners, accelerators, suppressors and levelers can be added.

In electroplating processes using the above plating baths, one or more of several methods of applying a current or voltage can be used. These include, for example: application of a constant current of about 1 $mA/cm^2$ to about 50 $mA/cm^2$ or equivalent potentials (electrode potentials of about −2V to about −3V versus NHE); and pulse plating with a first current of about 5 $mA/cm^2$ to about 250 $mA/cm^2$ for about 20 milliseconds to about 5 seconds such as about 0.1 second, and a second current of about 1.0 $\mu A/cm^2$ up to about 2 $mA/cm^2$ for about 0.1 seconds to about 10 seconds, including pulse plating with potentials of about −2V to about 3.5V versus NHE for about 1 cycle up to about 500 cycles such as 25 cycles. The temperature during processing can, for example, be about 20° C. to about 90° C.

Included in the above processing conditions are those in which there is applied a constant current of about 10 $mA/cm^2$ for about 30 minutes at room temperature with agitation at about 100 rpm.

Rhenium Electrodeposition:

A plating solution comprising about 1 g/liter to about 100 g/liter of $NH_4ReO_4$ and about 1 ml/liter to about 250 ml/liter of HCl (38%) can be used. For example, the plating solution can comprise about 10 g/liter of $NH_4ReO_4$ and about 10 ml/liter of HCl (38 wt. %), having a pH of about 1 to about 2. In addition to $NH_4ReO_4$, other perrhenate salts and inorganic Re salts can be used. In addition to HCl, other chloride salts can be used. In addition, other inorganic constituents (such as bromides, iodides, fluorides, sulfides, sulfates, boric acid, borates and metal salts) and organic additives (such as surfactants), can be added.

In electroplating processes using the above plating baths, one or more of several methods of applying a current or voltage can be used. These include, for example: application of a constant current of about 3 $mA/cm^2$ to about 50 $mA/cm^2$ or equivalent potentials (electrode potentials of about −2V to about −3V versus NHE); and pulse plating with a first current of about 5 $mA/cm^2$ to about 250 $mA/cm^2$ for about 20 milliseconds to about 5 seconds such as about 0.1 second, and a second current of about 1.0 $\mu A/cm^2$ up to about 2 $mA/cm^2$ for about 0.1 seconds to about 10 seconds, including pulse plating with potentials of about −2V to about 3.5V versus NHE for about 1 cycle up to about 500 cycles such as 25 cycles. The temperature during processing can, for example, range from about 20° C. to about 90° C.

Included within the above processing conditions are those in which there is applied a constant current of about 10 $mA/cm^2$ for about 120 seconds at room temperature, with agitation at about 400 rpm.

It is important to note that the construction and arrangement of the apparatuses and methods shown in the preferred and other exemplary embodiments is illustrative only. Although only a few embodiments of the present disclosure have been described in detail, those skilled in the art will readily appreciate that many modifications are possible (e.g. variations in sizes, dimensions, structures, shapes and proportions of the various elements, values of parameters, mounting arrangements, use of materials, colors, orientation, etc.) without materially departing from the novel teachings and advantages of the subject matter recited in the claims. Accordingly, all such modifications are intended to be included within the scope of the present disclosure as defined in the appended claims. The order or sequence of any process or method steps may be varied or re-sequenced according to alternative embodiments. Other substitution, modification, changes and omissions may be made in the design, operating conditions and arrangement of the embodiments without departing from the spirit of the present disclosure as expressed in the appended claims.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

All publications, patents and patent applications cited in this specification are herein incorporated by reference, and for any and all purposes, as if each individual publication, patent or patent application were specifically and individually indicates to be incorporated by reference. In this case of inconsistencies, the present disclosure will prevail.

The invention claimed is:

1. An electrochemical process comprising:
    immersing the face or part of the face of an SOI wafer to be electroplated into an electrolytic solution but not immersing the backside of the wafer (which is the surface of the wafer opposite the face to be electroplated) into the electrolytic solution, wherein the wafer has a buried oxide thickness of about 500 Å to about 1500 Å;
    positioning one or more anodes in front of the face of the wafer to be electroplated but not touching the wafer;
    positioning one or more cathodes in front of the face of the wafer to be electroplated but not touching the wafer;
    separating the anodes and cathodes from one another by an insulator, except for the ends, which face the face of the wafer to be electroplated;
    applying an electric power source to the anode and the cathode; and
    directly illuminating the backside of the wafer with an electron source but not illuminating electrolyte solution behind the backside of the wafer.

2. The electrochemical process of claim 1 wherein said SOI wafer further comprises a high-k oxide layer selected from $HfO_2$, $ZrO_2$, $Y_2O_3$, $La_2O_5$, HfSiO and $Al_2O_3$.

3. The electrochemical process of claim 2 wherein about 10 volts to about 40 volts is applied.

4. The electrochemical process of claim 2 wherein the electrochemical process is an electrodeposition process in which one or more elements from the group consisting of Ru, Re, Ni, Pd, Co, Pt, Rh, Cr, Mn, Cu, Fe, Zn, Cd, Ce, Ta, Hf, Ti, Al, V, Ga, Ge, As, Se, Nb, Mo, Ag, In, Sn, Sb, Te, W, Os, Ir, Au, Hg, Tl, Pb, Bi, P, B, C, N, O, Cl or any combination thereof is deposited on the wafer.

5. The electrochemical process of claim 1, wherein the electrolytic solution comprises copper and/or rhenium.

6. The electrochemical process of claim 1, wherein the electrolytic solution comprises an acid electrolyte.

7. The electrochemical process of claim 6, wherein the acid electrolyte is sulfuric acid.

8. The electrochemical process of claim 1, wherein the wafer is a p-type wafer.

9. The electrochemical process of claim 4 wherein a mask is used to selectively deposit a pattern on the wafer surface.

10. An apparatus comprising:
a plating tank containing an electrolytic solution;
a holder comprising an SOI wafer having a buried oxide thickness of about 500 Å to about 1500 Å that immerses the face of the wafer to be electroplated in the electrolytic solution but does not allow the backside of the wafer (which is the surface of the wafer opposite the face to be electroplated) to come into contact with the electrolytic solution;
one or more anodes adapted for coupling to an electric power source and positioned in front of the face of the wafer to be electroplated but not touching the wafer;
one or more cathodes adapted for coupling to an electric power source and positioned in front of the face of the wafer to be electroplated but not touching the wafer;
wherein the anode(s) and cathode(s) are separated from one another by an insulator, except for the ends, which face the face of the wafer to be electroplated; and
an illumination source that provides electrons to the backside of the wafer by directly illuminating the backside of the wafer without illuminating electrolyte solution behind the backside of the wafer.

11. The apparatus of claim 10 wherein the SOI wafer further comprises a high-k oxide layer selected from the group consisting of $HfO_2$, $ZrO_2$, $Y_2O_3$, $La_2O_5$, HfSiO and $Al_2O_3$.

12. The apparatus of claim 11 wherein said illumination source is a laser or a halogen lamp.

13. The apparatus of claim 12 wherein the power source applies a constant current, constant potential, a pulsed current, or a pulsed potential.

14. The apparatus of claim 10, wherein the electrolytic solution comprises copper and/or rhenium.

15. The apparatus of claim 10, wherein the electrolytic solution comprises an acid electrolyte.

16. The apparatus of claim 15, wherein the acid electrolyte is sulfuric acid.

17. The electrochemical apparatus of claim 10, wherein the wafer is a p-type wafer.

* * * * *